US012640214B2

(12) United States Patent
Lien et al.

(10) Patent No.: US 12,640,214 B2
(45) Date of Patent: May 26, 2026

(54) ACCESS LINE VOLTAGE RAMP RATE ADJUSTMENT

(71) Applicant: Micron Technology, Inc., Boise, ID (US)

(72) Inventors: Yu-Chung Lien, San Jose, CA (US); John Paul Aglubat, Meridian, ID (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 140 days.

(21) Appl. No.: 18/771,479

(22) Filed: Jul. 12, 2024

(65) Prior Publication Data

US 2025/0087283 A1      Mar. 13, 2025

Related U.S. Application Data

(60) Provisional application No. 63/537,990, filed on Sep. 12, 2023.

(51) Int. Cl.
| | |
|---|---|
| *G11C 11/34* | (2006.01) |
| *G11C 16/10* | (2006.01) |
| *G11C 16/12* | (2006.01) |
| *G11C 16/34* | (2006.01) |

(52) U.S. Cl.
CPC ........ *G11C 16/3459* (2013.01); *G11C 16/102* (2013.01); *G11C 16/12* (2013.01)

(58) Field of Classification Search
CPC .... G11C 16/3459; G11C 16/102; G11C 16/12
USPC ................................................... 365/185.22
See application file for complete search history.

(56) References Cited

U.S. PATENT DOCUMENTS

| | | | | |
|---|---|---|---|---|
| 7,746,703 B2 * | 6/2010 | Kim | ..................... | G11C 16/349 |
| | | | | 365/185.28 |
| 8,299,443 B1 * | 10/2012 | Shvartsburg | ........ | H01J 49/0018 |
| | | | | 250/396 R |
| 8,446,775 B2 * | 5/2013 | Kim | ................... | G11C 16/3468 |
| | | | | 365/185.19 |
| 8,472,259 B2 * | 6/2013 | Futatsuyama | ...... | G11C 16/3418 |
| | | | | 365/185.29 |

(Continued)

FOREIGN PATENT DOCUMENTS

| | | |
|---|---|---|
| KR | 102191436 | 12/2020 |

*Primary Examiner* — Viet Q Nguyen
(74) *Attorney, Agent, or Firm* — Brooks, Cameron & Huebsch, PLLC

(57) ABSTRACT

Access line voltage ramp rate adjustment is described herein. An apparatus may include a memory device including a plurality of groups of memory cells and a processing device coupled to the memory device which may receive a program command to be executed on one of the plurality of groups of memory cells and determine if a program verify (PVFY) loop associated with the program command is below a threshold for a subblock of the memory device that includes the one of the plurality of groups. Responsive to a determination that the PVFY loop is not below the threshold, the program command can be executed. Responsive to a determination that the PVFY loop is below the threshold, an unselected access line voltage ramp rate for the subblock can be adjusted to a slower rate, and the program command can be executed using the adjusted unselected access line voltage ramp rate.

20 Claims, 5 Drawing Sheets

(56)                    References Cited

U.S. PATENT DOCUMENTS

|  |  |  |  |  |
|---|---|---|---|---|
| 8,531,887 | B2 * | 9/2013 | Im | G11C 16/3454 |
|  |  |  |  | 365/185.21 |
| 8,724,395 | B2 * | 5/2014 | Park | G11C 16/0483 |
|  |  |  |  | 365/185.24 |
| 9,466,369 | B1 | 10/2016 | Pang et al. |  |
| 9,536,617 | B2 | 1/2017 | Al-Shamma et al. |  |
| 9,990,998 | B2 * | 6/2018 | Shikata | G11C 16/3459 |
| 10,163,511 | B2 * | 12/2018 | Nam | G11C 11/4087 |
| 10,468,111 | B1 | 11/2019 | Yang et al. |  |
| 10,629,279 | B2 * | 4/2020 | Yun | G11C 29/021 |
| 10,942,799 | B1 * | 3/2021 | Khakifirooz | G11C 16/14 |
| 11,423,986 | B2 * | 8/2022 | Choi | G11C 16/3459 |
| 12,046,314 | B2 * | 7/2024 | Zainuddin | H01L 24/80 |
| 12,142,330 | B2 * | 11/2024 | Lee | G11C 11/5628 |
| 12,176,032 | B2 * | 12/2024 | Zainuddin | H01L 25/0657 |
| 12,354,664 | B2 * | 7/2025 | Zainuddin | G11C 16/3459 |
| 2012/0163083 | A1 | 6/2012 | Dutta et al. |  |
| 2021/0098066 | A1 | 4/2021 | Yang |  |
| 2025/0157540 | A1 * | 5/2025 | Prakash | G11C 16/10 |

* cited by examiner

ACCESS LINE VOLTAGE RAMP RATE ADJUSTMENT

PRIORITY INFORMATION

This application claims the benefits of U.S. Provisional Application No. 63/537,990, filed on Sep. 12, 2023, the contents of which are incorporated herein by reference.

TECHNICAL FIELD

Embodiments of the disclosure relate generally to memory systems, and more specifically, relate to apparatuses, systems, and methods for access line voltage ramp rate adjustment in a non-volatile memory device.

BACKGROUND

A memory system can include a memory sub-system, which can be a storage device, a memory module, or a hybrid of a storage device and a memory module. Examples of a storage device include a solid-state drive (SSD), a Universal Flash Storage (UFS) drive, a secure digital (SD) card, an embedded Multiple Media Card (eMMC), and a hard disk drive (HDD). Examples of memory modules include a dual in-line memory module (DIMM) and various types of non-volatile dual in-line memory modules (NVDIMMs). Memory systems include one or more memory components (e.g., memory devices) that store data. The memory components can be, for example, non-volatile memory components (e.g., NAND flash memory devices) and volatile memory components (e.g., DRAM devices). In general, a host system can utilize a memory system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
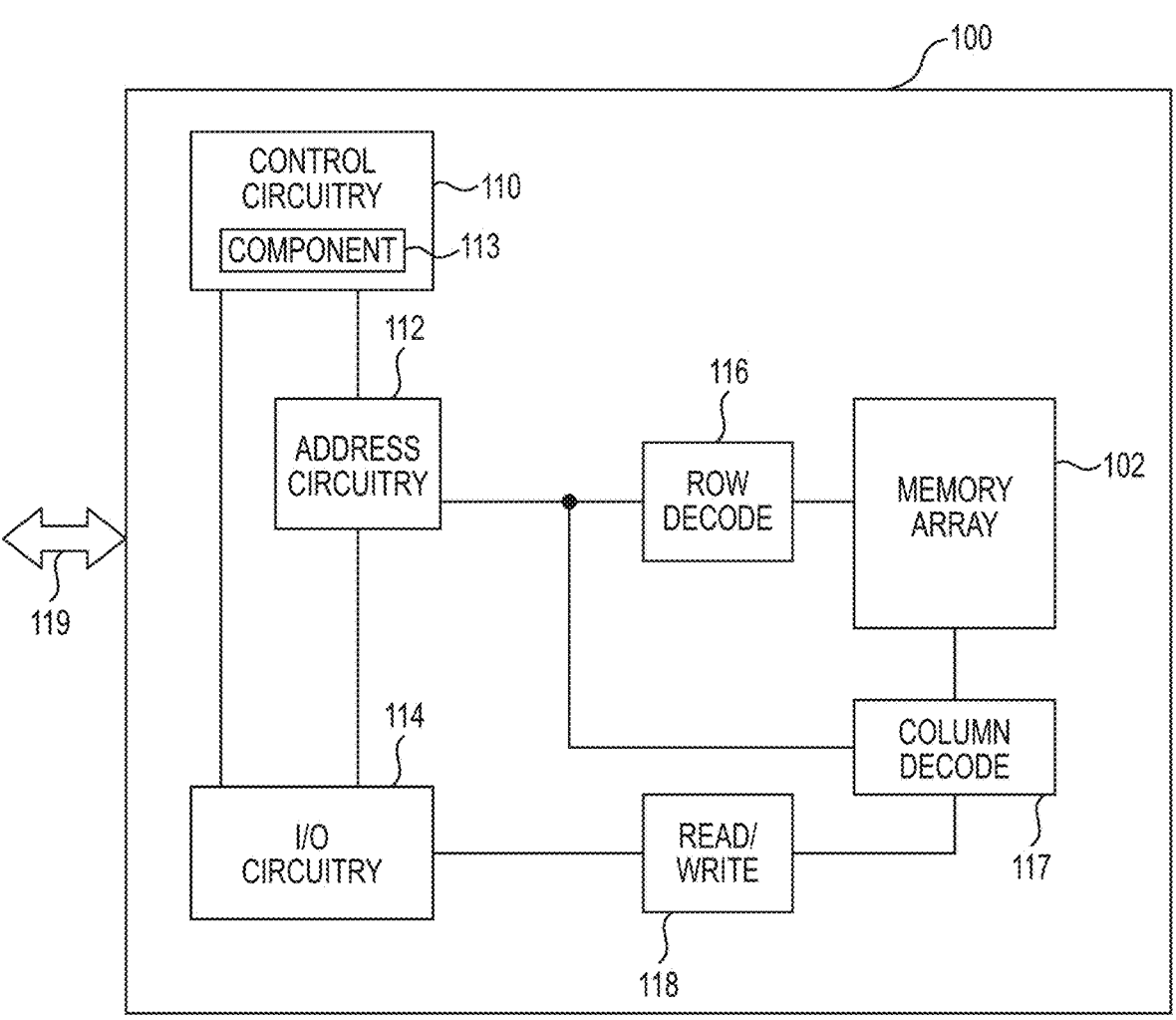
FIG. 1 illustrates an example portion of a memory system including a memory device having an array in accordance with various embodiments of the present disclosure.

Aspects of the present disclosure are directed to apparatuses, systems, and methods for access line voltage ramp rate adjustment. An apparatus may include a memory device including a plurality of groups of memory cells and a processing device coupled to the memory device. The processing device may receive a program command to be executed on one of the plurality of groups of memory cells and determine if a program verify (PVFY) loop associated with the program command is below a predetermined loop threshold for a subblock of the memory device that includes the one of the plurality of groups. Responsive to a determination that the PVFY loop is not below the predetermined loop threshold, the program command can be executed. Responsive to a determination that the PVFY loop is below the predetermined loop threshold an unselected access line voltage ramp rate for the subblock can be adjusted to a slower rate, and the program command can be executed using the adjusted unselected access line voltage ramp rate.

Various types of memory, such as NAND flash memory, include a memory array of many memory cells that can be arranged in row and column fashion and grouped in physical blocks. The cells can include a charge storage node such as a floating gate or charge-trap layer which allows the cells to be programmed to store one or more bits by adjusting the charge stored on the storage node. Generally, an erase operation (e.g., a "block erase") is performed to erase all of the cells of a block together as a group.

Three-dimensional (3D) flash memory (e.g., a 3D NAND memory array) can include multiple strings of memory cells with each string comprising multiple series-coupled (e.g., source to drain) memory cells in a vertical direction, with the memory cells of a string sharing a common channel region. Each memory cell of a string can correspond to a different tier of the memory array, with a group of strings sharing multiple access lines, which may be referred to as access lines (e.g., word lines (WLs)). Each access line can be coupled to respective memory cells of each string in the group of strings (e.g., the memory cells of a particular tier of the memory array). Groups of strings are coupled to respective sense lines, which may be referred to as data lines or bit lines (BLs), of a group of sense lines. The cells of the strings can be positioned between a drain-side select gate (referred to as a select gate drain (SGD)) and a source-side select gate (referred to as select gate source (SGS)) used to control access to the strings. A 3D NAND array can be a replacement gate (RG) NAND array or a floating gate NAND array, for example.

For some memory components of non-volatile memory, the voltage supply (Vcc) may be lower than a higher voltage bias used for various operations (e.g., pass voltage (VPASS), program voltage (VPGM), erase voltage (VERA), etc.) performed on the memory. Charge pump circuits can be used to increase the voltage bias to the voltage used for these operation, and a working frequency of the charge pump circuit can be determined using an access line ramp rate. For example, a faster access line ramp rate results in an increase in performance, but a current consumption increase. In contrast, a slower access line ramp rate results in a lower current consumption, but a reduced performance.

Output of the charge pump circuit can be coupled to various resistance loads for operations of an associated memory array. Examples of the present disclosure can include dynamically adjusting an access line ramp rate (or rates) to lower currents during a dynamic start voltage (DSV) sampling page for a program, which can reduce a peak power supply current with a minimal impact on typical page programming time (tPROG).

Put another way, average and peak power supply current are both important to non-volatile memory systems such as NAND systems, with the former determining a battery's lifetime and the latter potentially resulting in voltage drop that can cause chip malfunction. Systems may utilize peak power supply current for determining maximum parallelism performance evaluation. In an example, peak power supply current may be observed to be approximately 5% higher comparing a program in early subblocks (e.g., a subblock zero (SB0) to a subblock one (SB1)). For instance, this may be observed during an early subblock (e.g., a SB0) program's DSV sampling. A DSV, for instance, can be associated with each subblock and by tracking a program speed and/or program slope, utilizing DSV can allow for automatic adjustment of sampling rates associated with the program. When a first subblock finishes a program command, a DSV can be recorded, and can pass the DSV to a second subblock, which can reduce a number of programming loops used to execute a program command. A DSV may be associated with each access line in a memory cell, in some instances. Examples of the present disclosure can include lowering the peak power supply current during this period while minimizing the impact to overall tPROG performance. Accordingly, various embodiments of the present disclosure address the above and other deficiencies by providing apparatuses and methods that can adjust access line ramp rates during DSV sampling to reduce peak power supply current.

FIG. 1 illustrates an example portion of a memory system including a memory device 100 having an array 102 in accordance with various embodiments of the present disclosure. The memory array 102 can be a 3D NAND array such as described further in association with FIG. 2, for example. The array can comprise single level cells (SLCs) storing one bit per cell, multilevel cells (MLCs) storing two bits per cell, triple level cells (TLCs) storing three bits per cell, or quad level cells (QLCs) storing four bits per cell, for example. Embodiments are not limited to a particular type of memory cell. The memory device 100 can be part of a memory system such as memory system 590 described in FIG. 5.

The memory device 100 includes control circuitry 110, address circuitry 112, input/output (I/O) circuitry 114 used to communicate with an external device via an interface 119, which may be a bus used to transmit data, address, and control signals, among other signals between the memory device 100, and an external host device, which can include a controller (e.g., system controller such as controller 591 shown in FIG. 5), host processing device (e.g., host 592 shown in in FIG. 5), etc., that is capable of accessing the memory array 102. As an example, the memory device 100 can be within a system such as an SSD with the interface 119 coupling the memory device 100 to a system controller. The interface 119 can include a combined address, control, and data bus or separate busses depending on the particular physical interface and corresponding protocol. The interface 119 can be an Open NAND Flash Interface (ONFI) interface or a Non-Volatile Memory Express (NVMe) interface, a serial attached SCSI (SAS), a serial AT attachment (SATA) interface, a peripheral component interconnect express (PCIe) interface, an I2C/I3C interface, and/or other suitable interface (e.g., a parallel interface); however, embodiments are not limited to a particular type of interface or protocol.

The control circuitry 110 can decode signals (e.g., commands) received via interface 119 and executed to control operations performed on the memory array 102. The operations can include data programming operations, which may be referred to as write operations, data read operations, which may be referred to as sensing operations (and can include program verify operations), data erase operations, etc. The control circuitry 110 can cause various groups of memory cells (e.g., pages, blocks, erase blocks, etc.) to be selected or deselected in association with performing memory operations on the array 102. The control circuitry 110 can comprise a state machine, a sequencer, and/or some other type of control circuitry, which may be implemented in the form of hardware, firmware, or software, or any combination thereof. In various embodiments, the control circuitry 110 can include a component 113 that can compare PVFY loops and loop thresholds and adjust access line ramp rates accordingly. Although shown as being within the control circuitry 110, the component 113 can be located elsewhere in the device 100 and can be implemented in the form of hardware, firmware, or software, or any combination thereof. Although not shown in FIG. 1, the memory device 100 can include a table (e.g., a lookup table) used to determine access line ramp rates and/or loop thresholds, for example.

The I/O circuitry 114 is used for bi-directional communication of data between the memory array 102 and the external device via interface 119. The address circuitry 112, which can include a register, can latch address signals received thereto, and the address signals can be decoded by a row decoder 116 and a column decoder 117 to access the memory array 102. The memory device 100 includes read/write circuitry 118 used to read data from and write data to the memory array 102. As an example, the read/write circuitry can include various latch circuitry, drivers, sense amplifiers, buffers, etc. Data can be read from the memory array 102 by sensing voltage and/or current changes on bit lines of the memory array 102.

Figure 2:
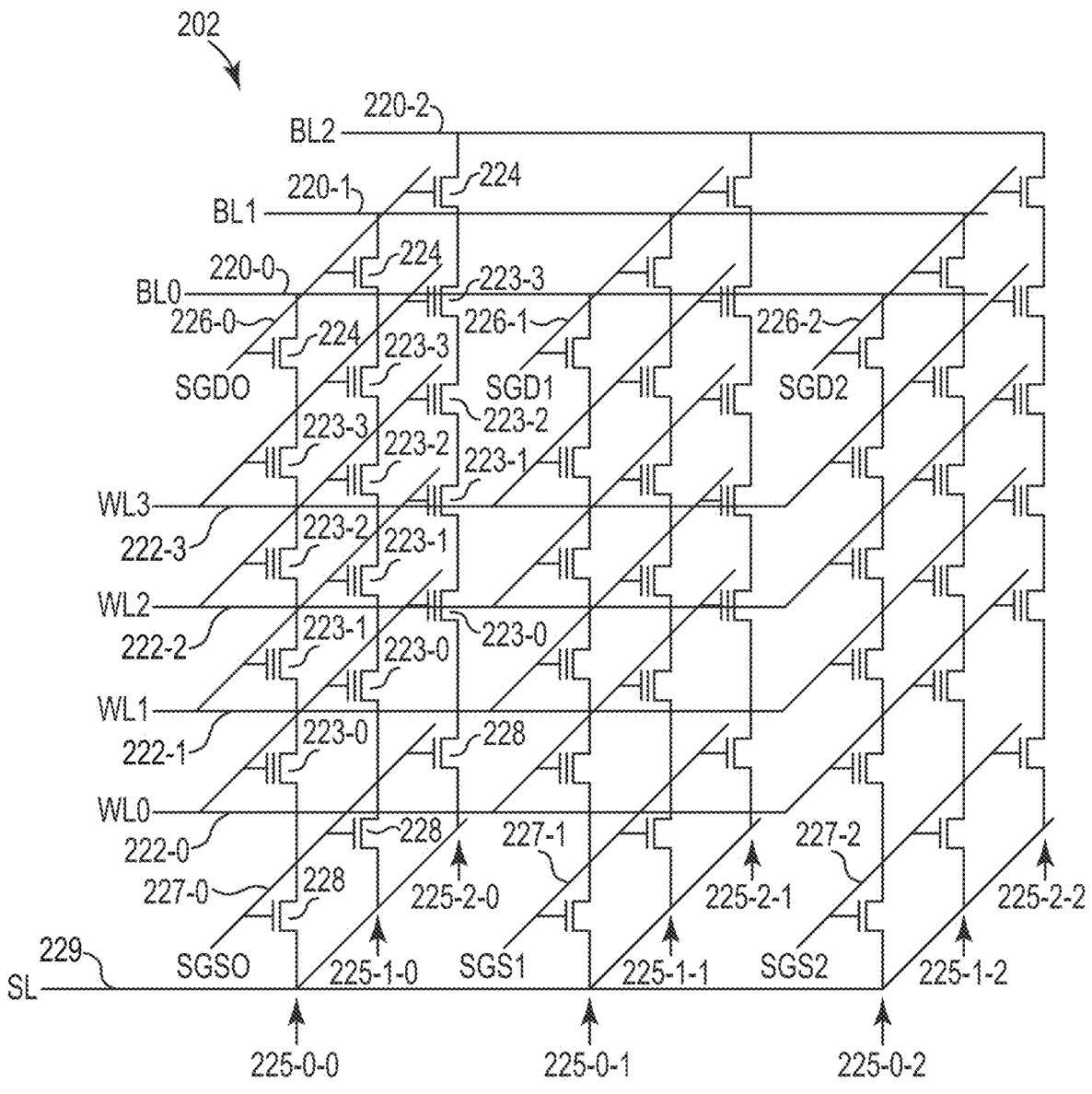
FIG. 2 is a schematic diagram illustrating an example memory array that can be operated in accordance with various embodiments of the present disclosure.

FIG. 2 is a schematic diagram illustrating an example memory array 202 in accordance with various embodiments of the present disclosure. The memory array 202 can be located in a memory device such as memory device 100 described in FIG. 1, for example. The memory array 200 is a 3D NAND array (e.g., an RG NAND array or a floating gate NAND array). Examples of the present disclosure are not limited to a 3D NAND array.

The memory array 200 comprises a number of access lines (e.g., word lines) 222-0 (WL0), 222-1 (WL1), 222-2 (WL2), and 222-3 (WL3) and a number of sense lines (bit lines) 220-0 (BL0), 220-1 (BL1), and 220-2 (BL2) coupled to multiple strings 225-0-0, 225-0-1, 225-0-2, 225-1-0, 225-1-1, 225-1-2, 225-2-0, 225-2-1, and 225-2-2. The access lines, bit lines, and strings are collectively referred to as access lines 222, bit lines 220, and strings 225, respectively. Although four access lines 222, three bit lines 220, and nine strings 225 are shown, embodiments are not so limited.

Each of the strings 225 comprises a number of memory cells (referred to collectively as memory cells 223) located between a select transistor 224 and a select transistor 228. For example, as shown in FIG. 2, strings 225-0-0, 225-1-0, and 225-1-2 each respectively comprise memory cells 223-0, 223-2, 223-2, and 223-3 located between select transistors 224 and 228 (e.g., respective drain-side select gate (SGD) 224 and source-side select gate (SGS) 228). The memory cells 223 can be floating gate transistors or charge trap cells with the cells 223 of a given string 225 sharing a common channel region (e.g., pillar). As shown, the memory cells 223 of a given string are series-coupled source to drain between the SGD transistor 224 and the SGS.

The memory cells 223 of the strings 225 are stacked vertically such that they are located on distinct tiers/levels of the memory array 202. Each access line 222 can be commonly coupled to all the memory cells at a particular tier/level. For example, access line 222-0 can be coupled to (e.g., as the control gate) the nine memory cells 223-0 corresponding to the nine respective strings 225.

The select gate transistors 224 and 228 can be controlled (e.g., turned on/off) via the corresponding select gate signals SGD0, SGD1, SGD2, SGS0, SGS1, and SGS2 in order to couple the strings 225 to their respective bit lines 220 and a common source line (SL) 229 during memory operations (e.g., reads, writes, erases). As shown in FIG. 2, the select gate signals SGD0, SGD1, and SGD2 are provided (e.g., to the gates of transistors 224) via respective conductive lines 226-0, 226-1, and 226-2, and the select gate signals SGS0, SGS1, and SGS2 are provided (e.g., to the gates of transistors 228) via respective conductive lines 227-0, 227-1, and 227-2. Although the signals SGS0, SGS1, and SGS2 are shown on separate conductive lines 227, in some embodiments the conductive lines 227-0, 227-1, and 227-2 may be coupled via a common SGS line.

To perform memory operations on the array 202, particular voltages (e.g., bias voltages) can be applied to the access lines 222, bit lines 220, and source line 229. The particular voltages applied depends on the memory operation being performed, and different voltages may be applied to the access lines 222 during a particular memory operation in order to store data in a cell (or page of cells) or read data from a cell.

In some examples, a charge pump circuit (not illustrated in FIG. 2) can be utilized to increase a programming voltage to be used in executing program commands (e.g., in performing program operations). The working frequency of the charge pump circuit can be determined based on an access line ramp rate, such that a higher access line ramp rate results in a faster voltage increase, but also greater current consumption. The higher voltage can be provided (e.g., distributed) to the array 202 for use in executing the program commands. Should a maximum allowed peak power (e.g., because of high current usage) be reached, the array 202 may not function properly, and should a voltage drop too low, the chip on which array 202 is located may malfunction. A peak power supply current can be used for maximum parallelism performance evaluation to calculate and distribute a peak power supply current specification for each array 202 of a memory apparatus.

Examples of the present disclosure are not limited to the architecture of memory array 202. For instance, a memory array in accordance with the disclosure can comprise single level cells (SLCs) storing one bit per cell, multilevel cells (MLCs) storing two bits per cell, triple level cells (TLCs) storing three bits per cell, or quad level cells (QLCs) storing four bits per cell, for example. Embodiments are not limited to a particular type of memory cell. The memory array 202 can be part of a memory system such as memory system 590 described in FIG. 5.

Figure 3:
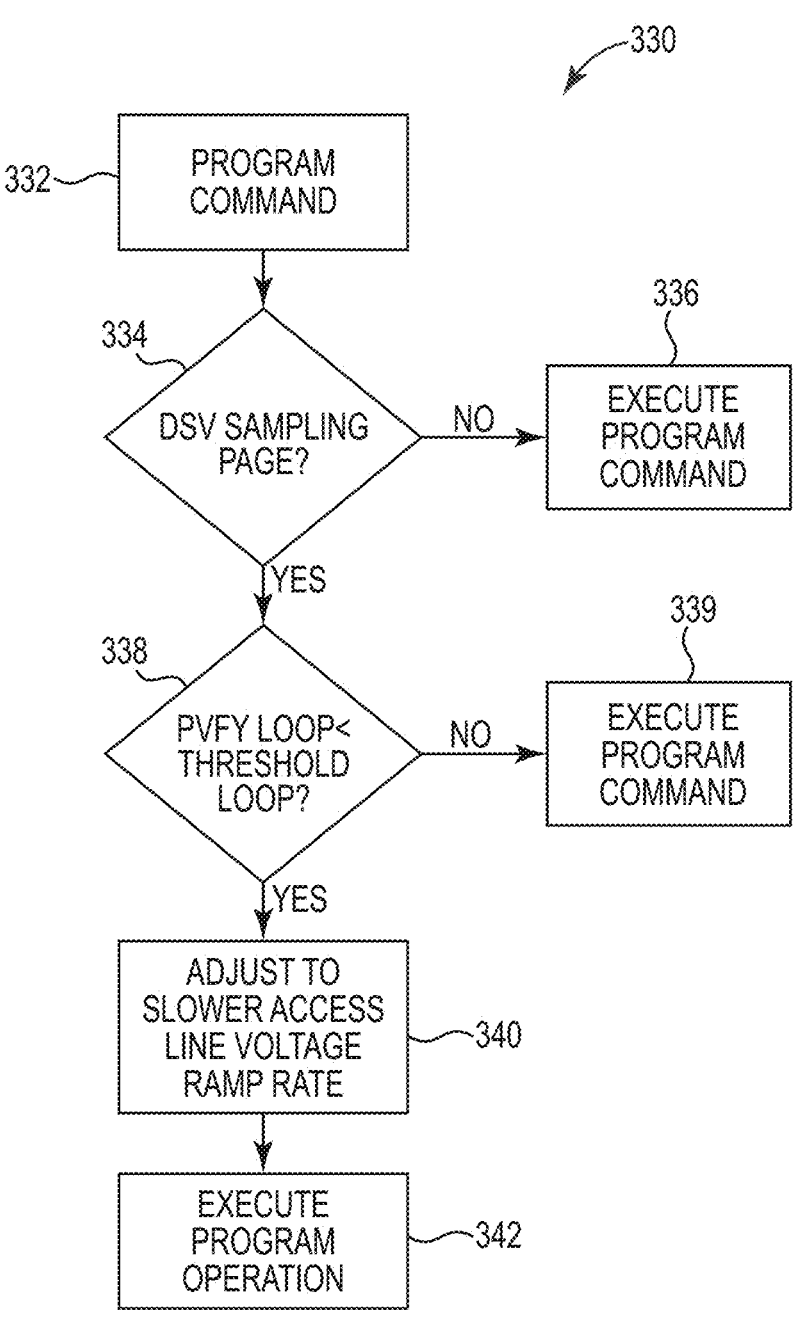
FIG. 3 is a flow diagram that illustrates an example method for access line voltage ramp rate adjustment in accordance with various embodiments of the present disclosure.

FIG. 3 is a flow diagram that illustrates an example method 330 for access line voltage ramp rate adjustment in accordance with various embodiments of the present disclosure. The method 330 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 330 is performed by the control circuitry 110 of FIG. 1 and/or the controller 591 of FIG. 5 including the processing device 594. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At step 332, a program command is received, for instance at a processing device (e.g., processing device 594) coupled to a memory device (e.g., memory device 100 and/or 500) comprising a plurality of groups of memory cells. The program command is to be executed on one of the plurality of groups of memory cells. For example, the program command can be an instruction or set of instructions to perform one or more operations (e.g., VPASS, VPGM, VERA, etc.) associated with a program operation.

At step 334, a determination can be made as to whether DSV sampling is occurring. For instance, a determination can be made whether or not the program command is to be executed on a DSV sampling page of the memory device. The plurality of groups of memory cells can include a DSV sampling page that includes single-level memory cells or multi-level memory cells, among others. If a determination is made that DSV sampling is not occurring (e.g., that the program command is not to be executed on a DSV sampling page), a program command (e.g., the program command received at step 332) can be executed at step 336.

If a determination is made at step 334 that DSV sampling is occurring (e.g., that the program command is to be executed on a DSV sampling page), a PVFY loop associated with the program command can be compared to a predetermined loop threshold for a subblock of the memory device that includes the one of the plurality of groups, and a determination of whether the PVFY loop is below the predetermined loop threshold can be made based on the comparison, at step 338. The PVFY loop, for instance, may be a first programming loop or a second programming loop of an associated programming cycle. The predetermined loop threshold can be a quantity of programming loops having an integer value (e.g., one loop, two loops, three loops, etc.) and/or a quantity of programming loops of a programming cycle for the subblock to reach a program verification. For instance, the loop threshold can be determined and generalized to an integer prior to the program command being received.

If a determination is made at step 338 that the PVFY loop is not below the predetermined loop threshold, the program command received at step 332 can be executed at step 339. If a determination is made at step 338 that the PVFY loop is below the predetermined loop threshold, an unselected access line voltage ramp rate for the subblock (e.g., the voltage ramp rate for the access lines of the subblock that are unselected during execution of the program operation) can be adjusted to a slower rate at step 340, and the program command can be executed using the adjusted unselected access line voltage ramp rate at step 342.

In some examples, adjusting the unselected access line voltage ramp rate can include adjusting the unselected access line voltage ramp rate to an unselected access line voltage ramp rate for a different subblock of memory cells. Adjusting the unselected access line voltage ramp rate, in some instances, can reduce the peak power supply current of the memory device, which can include reducing the peak power supply current between different subblocks of memory cells. An example illustrating such a reduction in peak power supply will be further described herein (e.g., in connection with FIG. 4).

In some examples, the program command can be executed in a number of orders. For instance, the program command may be executed in a source to drain order, or in a drain to source order.

Figure 4:
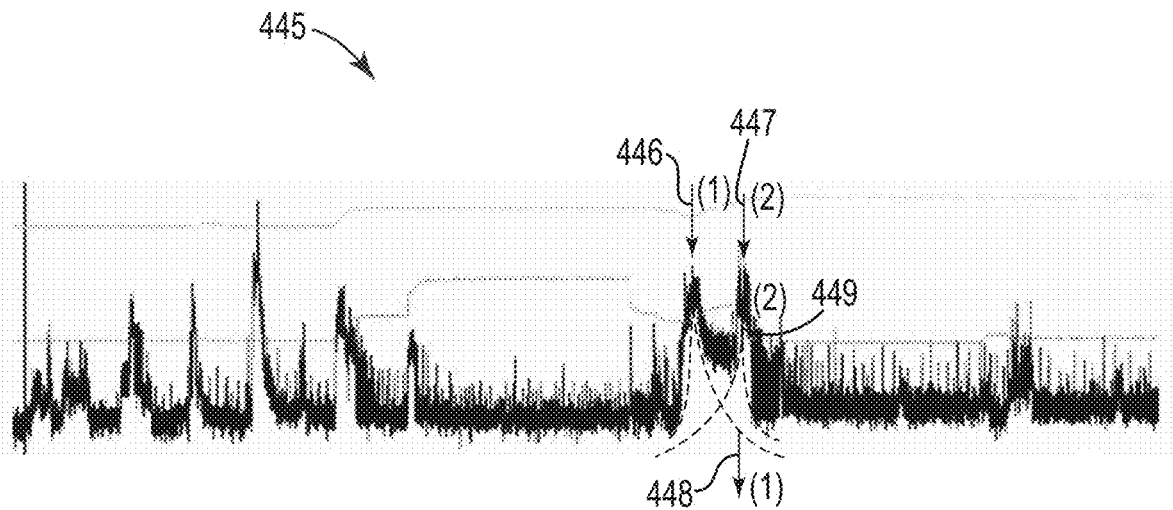
FIG. 4 is a graph illustrating example peak power supply currents with and without an access line voltage ramp rate adjustment in accordance with various embodiments of the present disclosure.

FIG. 4 is a graph 445 illustrating example peak power supply currents with and without an access line voltage ramp rate adjustment in accordance with various embodiments of the present disclosure. The graph 445 illustrates that without such an access line voltage ramp rate adjustment, overlap between an access line ramping operation and a sensing operation can result in undesirably high peak power supply currents. For instance, power supply current peak (2) at 447 is the combination of the tail of peak power supply current (1) 446 and peak power supply current (2) 449. However, the peak power supply current can be lowered, as shown at 448, when an access line voltage ramp rate for a program operation(s) e.g., the first PVFY operation) is adjusted to a slower rate, reducing the tail of power supply current peak (1) 446 to mitigate the high peak power supply current issue.

Figure 5:
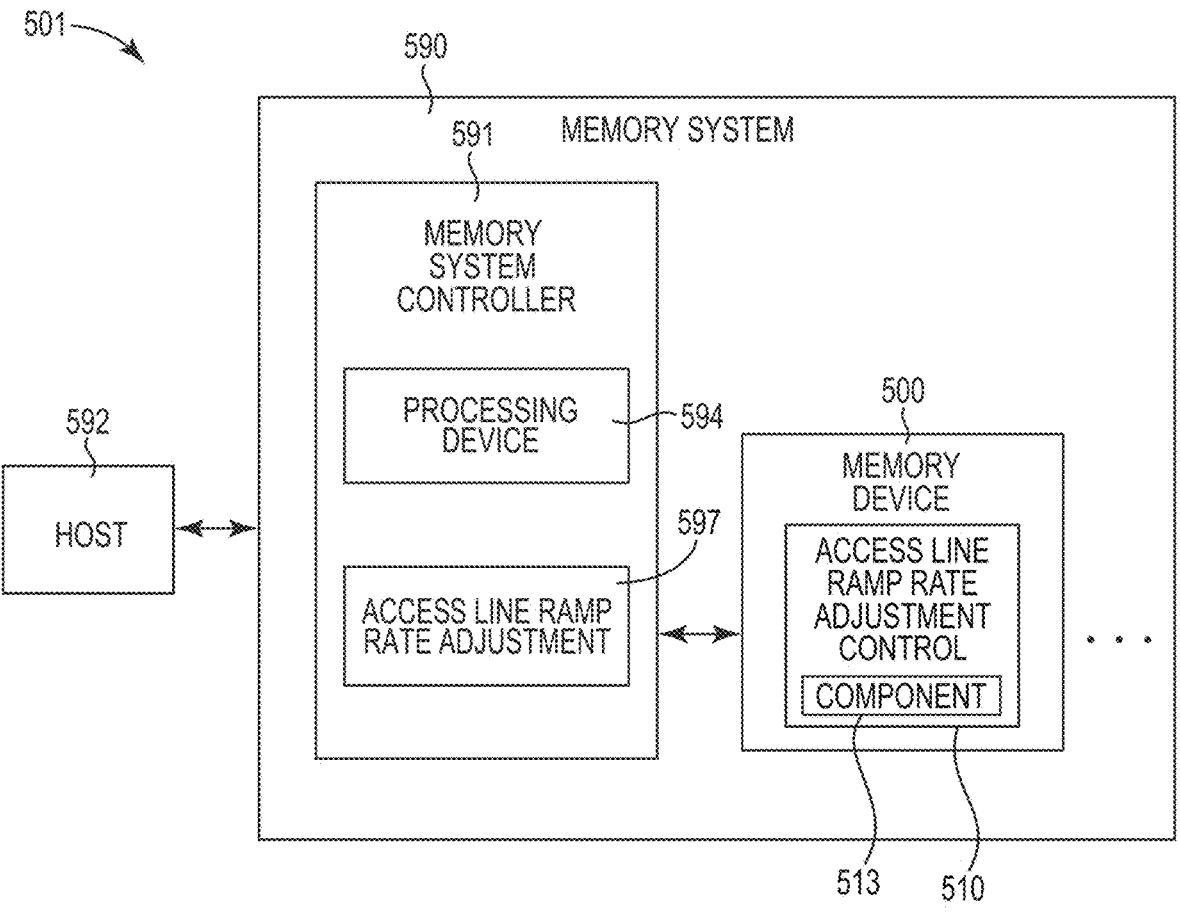
FIG. 5 illustrates an example computing system having a memory system for performing access line voltage ramp rate adjustment in accordance with various embodiments of the present disclosure.

FIG. 5 illustrates an example computing system 501 having a memory system 590 for performing access line voltage ramp rate adjustment in accordance with various embodiments of the present disclosure. As shown in FIG. 5, the memory system 590 includes a memory system controller 591 and a number of memory devices 500, which can be memory devices such as device 100 described in FIG. 1 (e.g., memory devices comprising memory arrays having multiple erase blocks coupled to common strings).

In some embodiments, the memory system 590 is a storage system. An example of a storage system is a solid-state drive (SSD). In some embodiments, the memory system 590 is a hybrid memory/storage sub-system. In general, the computing system 501 shown in FIG. 5 can include a host system 592 that uses the memory system 590. For example, the host system 592 can write data to the memory system 590 and read data from the memory system 590.

The memory system controller 591 (hereinafter referred to as "controller") can communicate with the memory devices 500 to perform operations such as reading data, writing data, or erasing data at the memory devices 500 and other such operations. The controller 591 can include hardware such as one or more integrated circuits and/or discrete components, a buffer memory, or a combination thereof. The controller 591 can include a microcontroller, special purpose logic circuitry (e.g., a field programmable gate array (FPGA), an application specific integrated circuit (ASIC), etc.), or other suitable processing circuitry. The controller 591 can include a processing device 594 (e.g., a processor) configured to execute instructions stored in local memory (not shown).

In this example, the controller 591 includes an access line voltage ramp rate adjustment component 597 that can be responsible for reducing an access line voltage ramp rate during a subblock's (e.g., a SB0) DSV sampling to lower a peak power supply current during that period while minimizing the impact to overall tPROG performance.

In general, the controller 591 can receive commands or operations from the host system 592 and can convert the commands or operations into instructions or appropriate commands to achieve the desired access to the memory devices 500. The controller 591 can be responsible for other operations such as wear leveling operations, garbage collection operations, error detection and error-correcting code (ECC) operations, encryption operations, caching operations, and address translations between a logical block address and a physical block address that are associated with the memory devices 500.

As illustrated in FIG. 5, the memory device 500 can include an access line voltage ramp rate adjustment control component 510, which can correspond to control circuitry (e.g., control circuitry 110 shown in FIG. 1). The component 510 can receive erase block program state information from the controller 591 and can include a component 513 that can compare PVFY loops and loop thresholds and adjust access line voltage ramp rates accordingly. The component 513 can include a look-up table, for example, used to determine the appropriate access line ramp rates based on the comparison.

The host system 592 can be a computing device such as a desktop computer, laptop computer, network server, mobile device, or other such computing device that includes a memory and a processing device. The host system 592 can include, or be coupled to, the memory system 590 so that the host system 592 can read data from or write data to the memory system 590. The host system 592 can be coupled to the memory system 590 via a physical host interface (not shown in FIG. 5). As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, a universal flash storage (UFS) interface, a universal serial bus (USB) interface, Fibre Channel, Serial Attached SCSI (SAS), etc. The physical host interface can be used to transmit data between the host system 592 and the memory system 590. The host system 592 can further utilize an NVM Express (NVMe) interface to access the memory devices 500 when the memory system 590 is coupled with the host system 592 by the PCIe interface. The physical host interface can provide an interface for passing control, address, data, and other signals between the memory system 590 and the host system 592.

While the example memory system 590 in FIG. 5 has been illustrated as including the controller 591, in another embodiment of the present disclosure, a memory system 590 may not include a controller 591, and can instead rely upon external control (e.g., provided by a processing device or controller separate from the memory system 590, such as by host system 592 communicating directly with the memory devices 500).

Although the memory system 590 is shown as physically separate from the host system 592, in a number of embodiments the memory system 590 can be embedded within the host system 592. Alternatively, the memory system 590 can be removable from the host system 592.

In some examples, the controller 591 (e.g., including the processing device 594) can receive a program command to be executed on one of the plurality of groups of memory cells of the memory device 500. The program command, for instance, can be a block-by-deck program command, a block-by-block program command, and/or a half good block program command, among others.

A determination of whether the program command is to be executed on a DSV sampling page of the memory device 500 can be made, and responsive to a determination that the program command is not to be executed on a DSV sampling page, the program command can be executed. The processing device 594, in some examples, can record a DSV used on an access line of the subblock (e.g., a first subblock (SB0)), and use the DSV on an access line of an additional subblock of the memory device (e.g., a second subblock (SB1)).

In contrast, responsive to a determination the program command is to be executed on a DSV sampling page, a determination can be made of whether a PVFY loop associated with the program command is below a predetermined loop threshold for a subblock of the memory device 500 that includes the one of the plurality of groups. For instance, a lookup table (e.g., component 513) may be used for comparison.

If a determination is made that the PVFY loop is not below the predetermined loop threshold, the program command can be executed. Responsive to a determination that the PVFY loop is below the predetermined loop threshold, an unselected access line voltage ramp rate for the subblock can be adjusted to a slower rate (e.g., utilizing access line ramp rate adjustment component 597 and access line ramp rate adjustment control component 510), and the program command can be executed using the adjusted unselected access line voltage ramp rate. The unselected access line voltage ramp rate can be adjusted to the slower rate, for instance, by slowing the unselected access line voltage ramp rate for at least one PVFY operation. For example, the first, the second, or both PVFY operations may have a slowed unselected access line voltage ramp rate.

As used herein, an "apparatus" can refer to various structural components. For example, the computing system 501 shown in FIG. 5 can be considered an apparatus. Alternatively, the host 592, the controller 591, and the memory device 500 might each separately be considered an apparatus.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, which manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, which can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

The figures herein follow a numbering convention in which the first digit or digits correspond to the drawing figure number and the remaining digits identify an element or component in the drawing. Similar elements or components between different figures may be identified by the use of similar digits. For example, 102 may reference element "02" in FIG. 1, and a similar element may be referenced as 202 in FIG. 2. As will be appreciated, elements shown in the various embodiments herein can be added, exchanged, and/or eliminated so as to provide a number of additional embodiments of the present disclosure.

For the purposes of the present disclosure, the phrase "A and/or B" means (A), (B), (A) or (B), or (A and B). For the purposes of the present disclosure, the phrase "A, B, and/or C" means (A), (B), (C), (A and B), (A and C), (B and C), or (A, B and C). Additionally, the phrase "at least one of A and B" means one or more of (A) or one or more of (B), or one or more of (A) and one or more of (B) such that both one or more of (A) and one or more of (B) is not required.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An apparatus, comprising:
   a memory device comprising a plurality of groups of memory cells; and
   a processing device coupled to the memory device and configured to:
   receive a program command to be executed on one of the plurality of groups of memory cells;
   determine if a program verify (PVFY) loop associated with the program command is below a predetermined loop threshold for a subblock of the memory device that includes the one of the plurality of groups;
   responsive to a determination that the PVFY loop is not below the predetermined loop threshold, execute the program command; and

responsive to a determination that the PVFY loop is below the predetermined loop threshold:
    adjust an unselected access line voltage ramp rate for the subblock to a slower rate; and
    execute the program command using the adjusted unselected access line voltage ramp rate.

2. The apparatus of claim 1, wherein the processing device is configured to:
    determine whether the program command is to be executed on a dynamic start voltage (DSV) sampling page of the memory device;
    execute the program command responsive to a determination that the program command is not to be executed on a DSV sampling page; and
    determine if the PVFY loop is below the predetermined loop threshold responsive to a determination that the program command is to be executed on a DSV sampling page.

3. The apparatus of claim 1, wherein the plurality of groups of memory cells includes a dynamic start voltage (DSV) sampling page comprising single-level memory cells.

4. The apparatus of claim 1, wherein the plurality of groups of memory cells includes a dynamic start voltage (DSV) sampling page comprising multi-level memory cells.

5. The apparatus of claim 1, wherein the PFVY loop is a first programming loop or a second programming loop of a programming cycle.

6. The apparatus of claim 1, wherein the predetermined loop threshold is a quantity of programming loops having an integer value.

7. The apparatus of claim 1, wherein the predetermined loop threshold is a quantity of programming loops of a programming cycle for the subblock to reach a program verification.

8. A method of operating memory, comprising:
    receiving a program command to be executed on a page of memory cells;
    comparing a program verify (PVFY) loop for a subblock of memory cells associated with the programming command to a loop threshold for the subblock;
    executing, in response to the comparison indicating the PVFY loop is not below the loop threshold, the program command; and
    in response to the comparison indicating the PVFY loop is below the loop threshold:
        adjusting an unselected access line voltage ramp rate for the subblock to a slower rate; and
        executing the program command using the adjusted unselected access line voltage ramp rate.

9. The method of claim 8, comprising:
    determining the loop threshold; and
    generalizing the loop threshold to an integer.

10. The method of claim 8, comprising executing the program command on the page of memory cells in a source to drain order.

11. The method of claim 8, comprising executing the program command on the page of memory cells in a drain to source order.

12. The method of claim 8, wherein adjusting the unselected access line voltage ramp rate to the slower rate comprises adjusting the unselected access line voltage ramp rate to an unselected access line voltage ramp rate for a different subblock of memory cells.

13. The method of claim 8, wherein adjusting the unselected access line voltage ramp rate to the slower rate reduces a peak power supply current of the memory.

14. The method of claim 13, wherein reducing the peak power supply current of the memory comprises reducing the peak power supply current between different subblocks of memory cells.

15. An apparatus, comprising:
    a memory device including a plurality of groups of memory cells; and
    a processing device coupled to the memory device and configured to:
        receive a program command to be executed on one of the plurality of groups of memory cells;
        determine whether the program command is to be executed on a dynamic start voltage (DSV) sampling page of the memory device;
        responsive to a determination that the program command is not to be executed on a DSV sampling page, execute the program command;
        responsive to a determination the program command is to be executed on a DSV sampling page, determine if a program verify (PVFY) loop associated with the program command is below a predetermined loop threshold for a subblock of the memory device that includes the one of the plurality of groups;
        responsive to a determination that the PVFY loop is not below the predetermined loop threshold, execute the program command; and
        responsive to a determination that the PVFY loop is below the predetermined loop threshold:
            adjust an unselected access line voltage ramp rate for the subblock to a slower rate; and
            execute the program command using the adjusted unselected access line voltage ramp rate.

16. The apparatus of claim 15, wherein the processing device is configured to:
    record a DSV used on an access line of the subblock; and
    use the DSV on an access line of an additional subblock of the memory device.

17. The apparatus of claim 15, wherein the program command is a block-by-deck program command.

18. The apparatus of claim 15, wherein the program command is a block-by-block program command.

19. The apparatus of claim 15, wherein the program command is a half good block program command.

20. The apparatus of claim 15, wherein the processing device is configured to adjust the unselected access line voltage ramp rate to the slower rate by slowing the unselected access line voltage ramp rate for at least one PVFY operation.

* * * * *